United States Patent [19]

Koike

[11] Patent Number: 4,602,269

[45] Date of Patent: Jul. 22, 1986

[54] HIGH SPEED DRIVING CIRCUIT

[75] Inventor: Hideharu Koike, Yokohama, Japan

[73] Assignee: Tokyo Shibaura Denki Kabushiki Kaisha, Kawasaki, Japan

[21] Appl. No.: 550,612

[22] Filed: Nov. 10, 1983

[30] Foreign Application Priority Data

Nov. 10, 1982 [JP] Japan .................. 57-197372

[51] Int. Cl.$^4$ .................. H01L 27/02; H03K 19/20; H03K 19/02; H03K 17/687
[52] U.S. Cl. .................. 357/42; 307/451; 307/576; 307/446
[58] Field of Search .................. 357/42; 307/451, 576, 307/446, 279

[56] References Cited

U.S. PATENT DOCUMENTS 4,262,340  4/1981  Sasaki et al. .................. 357/42
4,481,524  11/1984  Tsujide .................. 357/42

OTHER PUBLICATIONS

H. Higuchi et al, "High Performance Bipolar LSIs: Their Present Status and Future", 1982 VLSI Symposium.

Primary Examiner—Martin H. Edlow
Assistant Examiner—Terri M. Henn
Attorney, Agent, or Firm—Schwartz, Jeffery, Schwaab, Mack, Blumenthal & Evans

[57] ABSTRACT

A semiconductor device comprises a complementary FET circuit wherein respective gate and drain of a P-channel FET are commonly connected to those of an N-channel FET with each other, the common node of each gate serves as an input terminal, while the common node of each drain serves as an output terminal, and the source of each FET is connected to said first and second reference power sources. The semiconductor device further comprises an additional complementary FET circuit wherein respective gate and drain of a P-channel FET are commonly connected to those of an N-channel FET with each other, the common node of each drain is connected to the input terminal, while the common node of each gate is connected to the output terminal, and the source of each FET is connected to the output terminal, and the source of each FET is connected to the wafer of the complementary FET circuit.

3 Claims, 6 Drawing Figures

HIGH SPEED DRIVING CIRCUIT

BACKGROUND OF THE INVENTION

1. The Field of the Invention

The present invention relates to a semiconductor device, and more particularly to a semiconductor device which can be driven at a high speed as an inverter circuit.

2. The Technical Background of the Invention

Taking the case of inverter circuits, so called C-MOS (Complementary Metal-Oxide-Semiconductor) inverter circuits are well known. The C-MOS inverter circuit is comprised of a pair of field effect transistors (FETs) comprising a P-channel MOS-FET and an N-channel MOS-FET.

The C-MOS inverter circuit has the advantage that the output voltage is precisely determined because it is completely equal to the reference power supply voltage, but has the drawback that the driving capability is not large.

In view of this, another circuit with enhancement of driving capability is proposed, which is called "Bi-CMOS circuit" constituted by combining a pair of bipolar transistors with a C-MOS circuit.

However, the Bi-CMOS circuit has the opposite relationship in connection with the advantage and drawback with the C-MOS circuit. Namely, with the Bi-CMOS circuit, the output voltage is not precise.

SUMMARY OF THE INVENTION

With the above in view, an object of the invention is to provide a semiconductor device of which the electric potential of output signals is completely equal to that of the reference power source, and is able to be driven at a high speed.

Another object of the present invention is to provide a semiconductor device operative as an inverter circuit, the semiconductor device having C-MOS structure, the electric potential of output signals thereof being completely equal to that of the reference power source, and being able to be driven at a high speed.

To achieve these objects, according to the present invention, there is provided a semiconductor device comprising: a complementary FET circuit wherein respective gate and drain of a P-channel FET are commonly connected to those of an N-channel FET with each other, the common node of each gate thereof serves as an input terminal, while the common node of each drain serves as an output terminal, and the source of each FET is connected to a first and a second reference power sources; and an additional complementary FET circuit coupled to the complementary FET circuit, the additional complementary FET wherein respective gate and drain of a P-channel FET are commonly connected to those of an N-channel FET with each other, the common node of each drain is connected to the input terminal, while the common node of each gate is connected to the output terminal, and the source of each FET is connected to the wafer of the complementary FET circuit.

By adding another complementary FET circuit to the elementary complementary FET, the semiconductor device according to the present invention has the same precision in the electric potential of the output signals thereof as that in the C-MOS circuit, and makes it possible to improve the driving capability.

DETAILED DESCRIPTION OF THE INVENTION

Prior to the description of the invention, the prior art underlying the present invention will be described with reference to FIGS. 5 and 6, and then the preferred embodiments according to the present invention will be described with reference to FIGS. 1 to 4.

Figure 5:
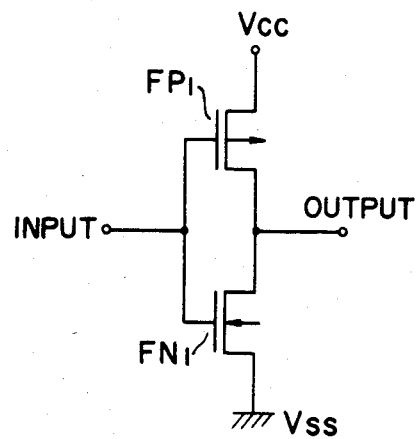
FIGS. 5 and 6 are circuit diagrams illustrating prior art semiconductor devices.

Referring to FIG. 5, there is shown the prior art inverter circuit comprising a P-channel MOSFET $FP_1$, and an N-channel MOSFET $FN_1$ connected in series between reference power sources Vcc and Vss, wherein each gate of MOSFETs is commonly connected to an input terminal, and each drain thereof is commonly connected to an output terminal.

However, when the C-MOS inverter circuit is formed using so-called Silicon on Sapphire (SOS) technology featured by vapor-phase growing a silicon single crystal on a sapphire wafer, there arises the problem that sufficient driving capability cannot be obtained because of the floating wafer effect wherein the sapphire wafer is inverse-biased, thereby lowering switching speed.

Figure 6:
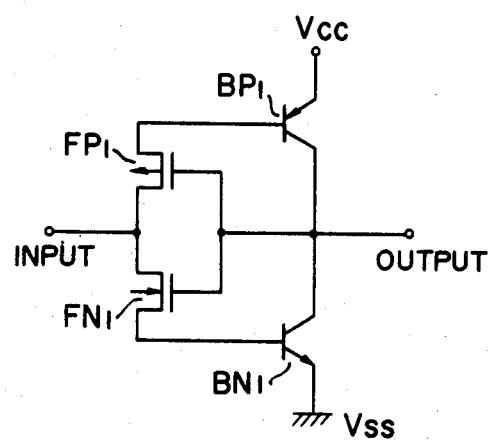

Further, as shown in FIG. 6, there is proposed a Bi-CMOS circuit comprising a P-channel MOSFET $FP_1$ and an N-channel MOSFET $FN_1$ connected in series wherein each drain of MOSFETs $FP_1$ and $FN_1$ is commonly connected to an input terminal, and each gate thereof is commonly connected to an output terminal. The Bi-CMOS circuit further comprises a PNP-type bipolar transistor $BP_1$ and an NPN-type bipolar transistor $BN_1$ connected in series, and each collector commonly connected is connected to an output terminal. The reference power sources Vcc and Vss are connected to the emitters of the bipolar transistors $BP_1$ and $BN_1$, respectively, and bases thereof are connected to sources of the FETs $FP_1$ and $FN_1$, respectively. The Bi-CMOS circuit is operative in such a manner that the input level thereof is opposite to the output level thereof, thereby constituting an inverter circuit.

With this Bi-CMOS circuit, when the input is inverted in the Bi-CMOS circuit, a base current of either of the bipolar transistors $BP_1$ and $BN_1$ flows. However, in this instance, before the level of the output signal completely arrives at Vss or Vcc, the base current is placed in an interrupted condition with the threshold level of the FET $FP_1$ or $FN_1$ being left, resulting in the problem that the electric potential of the output signal is not completely equal to Vss or Vcc.

PREFERRED EMBODIMENT OF THE INVENTION

Figure 1:
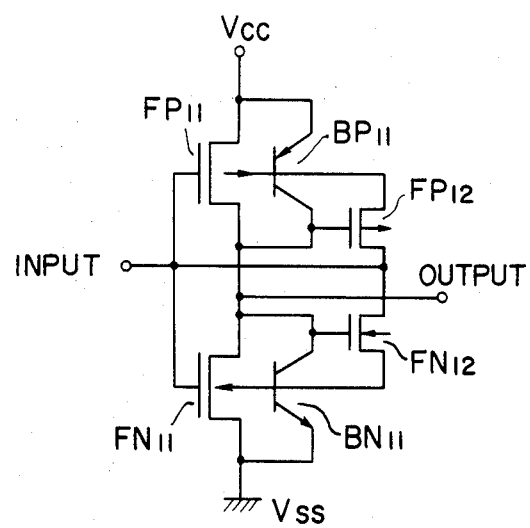
FIG. 1 is a circuit diagram illustrating a first embodiment of a semiconductor device according to the present invention.

Referring to FIG. 1, there is shown a first embodiment of a semiconductor device according to the present invention. As the whole circuit construction, the semiconductor device constitutes an inverter circuit. Between reference power supplies Vcc and Vss, there is provided a P-channel MOSFET $FP_{11}$ and an N-channel MOSFET $FN_{11}$ connected in series in such a manner that each drain is commonly connected. An input terminal is connected to the gate of these FETs $FP_{11}$ and $FN_{11}$, and the drain of the FETs $FP_{11}$ and $FN_{11}$ commonly connected is connected to an output terminal. A PNP-type bipolar transistor $BP_{11}$ is connected in parallel with the MOSFET $FP_{11}$ in such a manner that the emitter is connected to the source, and the collector is connected to the drain. The base of the bipolar transistor $BP_{11}$ is connected to the wafer of the FET $FP_{11}$. Likewise, an NPN-type bipolar transistor $BN_{11}$ is connected in parallel with the MOSFET $FN_{11}$ in such a manner that the emitter is connected to the source, and the collector is connected to the drain. The base of the NPN-type bipolar transistor $BN_{11}$ is connected to the wafer of the FET $FN_{11}$. The source of a P-channel MOSFET $FP_{12}$ is connected to the wafer of the FET $FP_{11}$, and the gate thereof is connected to the drain of the FET $FP_{11}$. Likewise, the source of an N-channel MOSFET $FN_{12}$ is connected to the wafer of the FET $FN_{11}$, and the gate thereof is connected to the drain of the FET $FN_{11}$. The drains of those FETs $FP_{12}$ and $FN_{12}$ are commonly connected, respectively, and the common node thereof is connected to the input terminal.

The operation of the semiconductor device thus constructed will be described. When the level at the input terminal varies from O[V] to Vcc[V], the level at the output terminal is Vcc at first. Accordingly, the N-channel MOSFET $FN_{12}$ is conductive. As a result, the base current of the bipolar transistor $BN_{11}$ is supplied from the input terminal through the FET $FN_{12}$, whereby the bipolar transistor $BN_{11}$ becomes conductive. Accordingly, as the level at the input terminal rises, the voltage appearing at the output terminal lowers. As a result, when the output voltage is below the threshold voltage of the FET $FN_{12}$, the FET $FN_{12}$ is turned off whereby the base current flowing into the bipolar transistor is not supplied. However, the FET $FN_{11}$ becomes conductive in accordance with the elevation of the level at the input terminal, whereby the output voltage is O[V]. At this time, the FET $FP_{11}$ becomes cut off in accordance with the elevation of the input terminal of the FET $FP_{11}$, whereby the FET $FP_{12}$ becomes conductive. For this reason, the bipolar transistor $BP_{11}$ is turned off because the electric potential at the base is equal to that at the emitter. Thus, the electric potential at the output terminal is inverted to completely become O[V].

Next, the operation when the electric potential at the input terminal conversely varies from Vcc[V] to O[V] will be described. Since the electric potential at the output terminal is maintained O[V] at first, the P-channel MOSFET $FP_{12}$ is conductive. Accordingly, a base current flows out from the base of the bipolar transistor $BP_{11}$ to the input terminal through the FET $FP_{12}$. As a result, the bipolar transistor becomes conductive. The voltage appearing at the output terminal rises according as the voltage appearing at the input terminal lowers. As a result, when the voltage appearing at the output terminal is above $Vcc-V_{TH}$[V] (V is a threshold voltage of the FET $FP_{12}$), the FET $FP_{12}$ becomes cut off. Accordingly, the base current from the bipolar transistor $BP_{11}$ cannot flow out, resulting in the interruption of the bipolar transistor $BP_{11}$. However, the P-channel MOSFET $FP_{11}$ becomes conductive to raise the voltage appearing at the output terminal to Vcc[V]. At this time, because the FET $FN_{11}$ is cut off, the FET $FN_{12}$ is conductive, the voltage between the base and the emitter of the bipolar transistor $BN_{11}$ becomes O[V], whereby the bipolar transistor $BN_{11}$ becomes cut off. Thus, the electric potential at the output terminal is inverted so that it completely becomes Vcc[V].

According to this embodiment, the electric potential of the output signal completely becomes the electric potential of the reference power sources, that is, O[V] or Vcc[V]. Further, since the bipolar transistors having high driving capability are connected in parallel with the driver FET, high speed drive is possible.

Figure 2:
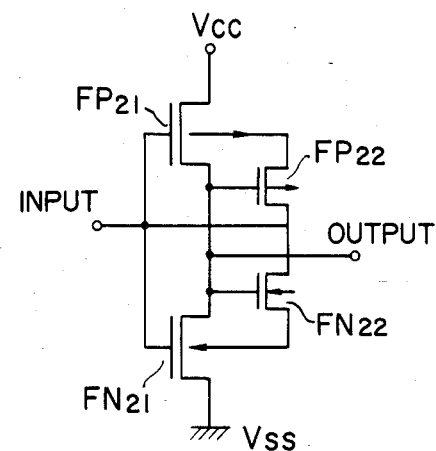
FIG. 2 is a circuit diagram illustrating a second embodiment of a semiconductor device according to the present invention.
Figure 3:
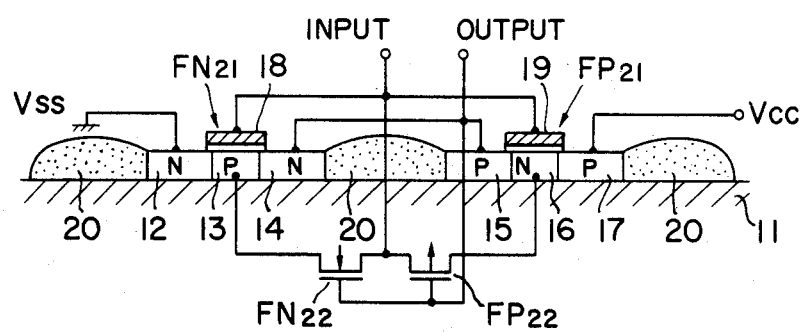
FIG. 3 is a cross sectional view of the semiconductor device shown in FIG. 2.
Figure 4:
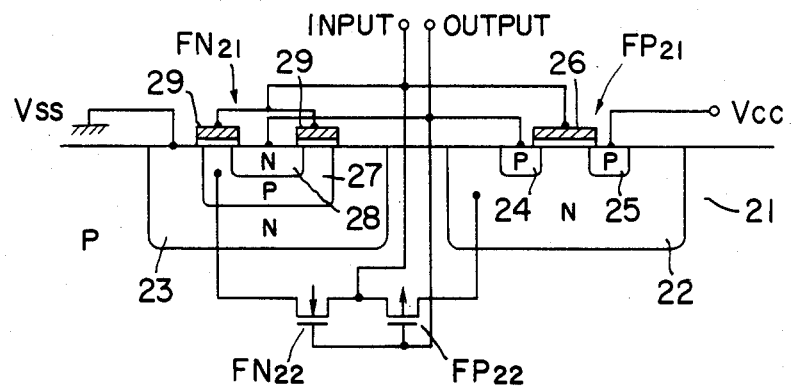
FIG. 4 is a cross sectional view of the semiconductor device shown in FIG. 2.

Reference is now made to the second embodiment of a semiconductor device shown in FIGS. 2, 3 and 4. In the first embodiment, the bipolar transistor is fabricated separately from the MOSFET, and the wiring is implemented so as to constitute the FIG. 1 circuit. On the contrary, in accordance with the second embodiment, the bipolar transistor and the FET are integrally fabricated. The circuit construction of a semiconductor device according to the second embodiment is shown in FIG. 2. In this embodiment, a P-channel MOSFET $FP_{21}$ and an N-channel MOSFET $FN_{21}$ are connected in series in such a manner that each drain thereof is commonly connected. The input terminal is connected to each gate of the FETs $FP_{21}$ and $FN_{21}$, and each drain of the FETs $FP_{21}$ and $FN_{21}$ is commonly connected to the output terminal. The P-channel MOSFET $FP_{22}$ and the N-channel MOSFET $FN_{22}$ are connected to the input terminal in such a manner that each drain thereof is commonly connected. These FETs $FP_{22}$ and $FN_{22}$ are connected to the output terminal in such a manner that each gate thereof is commonly connected. Each source of the FETs $FP_{22}$ and $FN_{22}$ is connected to the wafer of the FETs $FP_{21}$ and $FN_{21}$. As stated above, the circuit construction according to this embodiment is such that the bipolar transistors provided in the first embodiment are eliminated. The operational function is equivalent to that with the circuit construction shown in FIG. 1. Namely, the FETs $FP_{21}$ and $FN_{21}$ are such that the field effect transistor and the bipolar transistor are substantially integrated.

Referring to FIG. 3, there is shown the semiconductor device according to the present embodiment fabricated by SOS technology. N-type and P-type silicon single crystal thin films are vapor-phase grown on the sapphire wafer 11. The part illustrated as a sectional view in FIG. 3 shows the part of the FETs $FN_{21}$ and $FP_{21}$. The N-channel MOSFET $FN_{21}$ is formed by N-type single crystal thin films 12 and 14 surrounding a P-type single crystal thin film 13, thereby forming a gate 18 on the P-type single crystal thin film 13. The FET $FN_{21}$ thus constructed operates as an N-channel FET with the P-type single crystal thin film 13 serving as a wafer, and at the same time operates as an NPN-type bipolar transistor constituted by the N-type thin film 12, the P-type thin film 13 and the N-type thin film 14. Likewise, the P-channel MOSFET $FP_{21}$ is formed by P-type thin films 15 and 17, an N-type thin film 16 and a gate 19, which operates as a P-channel MOSFET, and at the same time operates as a PNP-type bipolar transistor. The portion between the P-type and the N-type thin films is filled with an oxide silicon 20, thereby to be insulated.

Referring to FIG. 4, there is shown the semiconductor device according to the present embodiment fabricated by MOS technology. The part illustrated as a cross sectional view shows the part of FETs $FN_{21}$ and $FP_{21}$, similar to that of FIG. 3. N-type regions 22 and 23 are formed in a P-type wafer 21, and P-type regions 25 and 24 serving as a source and a drain, respectively are formed in the N-type region 22. A P-type region 27 is formed in the N-type region 23, and an N-type region 28 is further formed therein. The FET $FP_{21}$ further comprises a gate 26, and operates as a P-channel MOSFET with the N-type region 23 serving as a wafer, and at the same time operates as a PNP-type bipolar transistor comprising the P-type region 24, the N-type region 22 and the P-type region 25. Likewise, the FET $FN_{21}$ further comprises a gate 29, and operates as an N-channel MOSFET, and at the same time operates as an NPN-type bipolar transistor comprising an N-type region 23, a P-type region 27 and an N-type region 28.

Thus, the second embodiment makes it possible to provide a semiconductor device which can be driven at a high speed using conventional fabricating technology without using special fabricating technology required for forming a MOS transistor and a bipolar transistor on the same semiconductor wafer.

The advantages obtained with the invention

As stated above, electric potential of output signals is completely equal to that of the reference power source, and the semiconductor device has large driving capability and can operate at a high speed.

What is claimed is:

1. A semiconductor circuit comprising:
   (a) a complementary field effect transistor circuit, wherein a first gate and a first drain of a first field effect transistor of a first conductivity type are connected to a second gate and a second drain of a second field effect transistor of a second conductivity type, respectively, said first and second gates serving as an input terminal, and said first and second drains serving as an output terminal, and a source of each field effect transistor being connected to first and second reference power sources, and
   (b) an additional complementary field effect transistor circuit, wherein a third gate and a third drain of a third field effect transistor of the first conductivity type are connected to a fourth gate and a fourth drain of a fourth field effect transistor of the second conductivity type, said third and fourth drains being connected to said input terminal, and said third and fourth gates being connected to said output terminal, and a source of each of said third and fourth field effect transistors being connected to a substrate of a transistor of said complementary field effect transistor circuit.

2. A semiconductor device according to claim 1, wherein said complementary field effect transistor is formed on a wafer of sapphire.

3. A semiconductor device according to claim 1, wherein said complementary field effect transistor is formed on a semiconductor wafer.

* * * * *